United States Patent [19]

Suzuki et al.

[11] Patent Number: 4,760,325
[45] Date of Patent: Jul. 26, 1988

[54] HIGH FREQUENCY COIL ARRANGEMENT

[75] Inventors: Masato Suzuki; Tatsushi Shinoda; Hiromi Murakami, all of Tsurugashima, Japan

[73] Assignee: Toko Kabushiki Kaisha, Tokyo, Japan

[21] Appl. No.: 41,528

[22] Filed: Apr. 23, 1987

[30] Foreign Application Priority Data

Apr. 28, 1986 [JP] Japan ............................ 61-64438[U]

[51] Int. Cl.⁴ .......................... H03J 3/20; H04B 1/26
[52] U.S. Cl. .................................... 323/355; 333/177; 333/184; 334/78; 358/191.1; 455/323; 455/326
[58] Field of Search ................................ 323/355–359; 333/174, 177, 178, 180, 184, 185; 455/323–326; 329/140; 358/190, 191.1; 334/78

[56] References Cited

U.S. PATENT DOCUMENTS 3,184,690  5/1965  Garland .......................... 455/326 X
3,727,078  4/1973  Wollesen ........................ 455/326 X Primary Examiner—Patrick R. Salce
Assistant Examiner—Emanuel Todd Voeltz
Attorney, Agent, or Firm—Stevens, Davis, Miller & Mosher

[57] ABSTRACT

A high frequency coil arrangement, comprising an input side coil and an output side coil electromagnetically coupled with each other, the input side coil being divided into two coil elements having substantially equal inductances by provision of a tap, characterized in that two parallel tuner capacitors are provided for the two coil elements for providing two tuner circuits of equal frequencies, and that a further separate capacitor is provided and connected with both ends of the input side coil for adjustment of its tuning frequency.

3 Claims, 2 Drawing Sheets

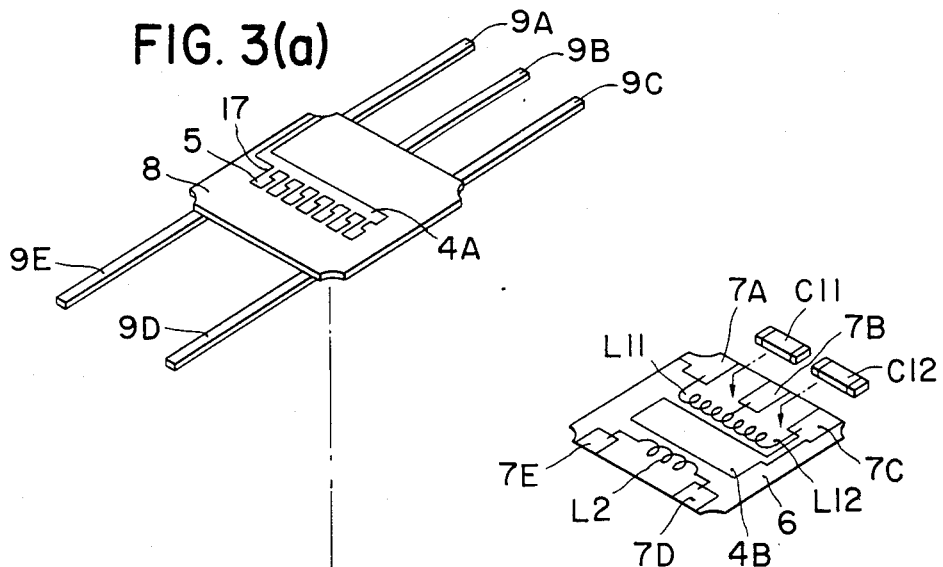
FIG. 3(a)
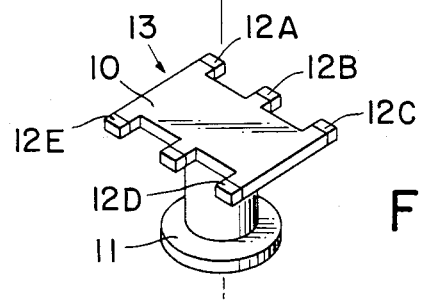
FIG.3(b)
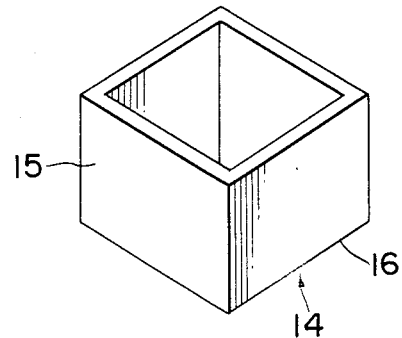
FIG.3(c)
FIG.3(d)

HIGH FREQUENCY COIL ARRANGEMENT

FIELD OF THE ART

This invention relates to the structure of a high frequency coil to be used mainly in double balanced mixers (to be referred to as DBM hereinafter).

BACKGROUND OF THE INVENTION

A conventional high frequency coil of the above kind is shown by way of example in the form of a wiring diagram in FIG. 4, wherein an input side coil and an output side coil electromagnetically coupled together are provided. The input side coil is divided into two coil elements L11 and L12 having substantially the same inductances by the provision of a center tap 1. To these coil elements L11 and L12, tuning capacitors C11 and C12 are connected respectively in parallel, thereby providing two like tuning circuits of the same frequency. A signal is applied, together with a local oscillator signal, to terminals 2 and 3 arranged at the ends of the input side coil, and a frequency-converted or more specifically as an intermediate frequency signal is obtained from the output side coil L2. Additionally, the tap 1 is grounded.

It is a most important requirement to couple both coil elements L11 and L12 with output side coil L2 in the same manner, to provide the same transmission characteristics thereamong and to reduce a frequency difference between the two tuning circuits to nil.

Adjustment of the two tuning circuit frequencies is carried out conventionally by moving cores arranged in close proximity to related coils, so as to modify the respective inductances. However, when the overall dimensions of the high frequency coil assembly are highly minimized so as to arranged the within a cube of less than 4 mm on a side, the conventional arrangement is not practical due to realizable mechanical machinability and strength requirements of the cores.

SUMMARY OF THE INVENTION

The object of the present invention is to provide a high frequency coil arrangement which has an easy tuning frequency adjustment even when highly miniatured and which employs an adjustable capacitor.

To achieve this object, the present invention provides a high frequency coil arrangement comprising an input side coil and an output side coil, said input side coil being divided into two coil elements of substantially equal inductances by provision of a tap and connected with respective tuning capacitors respectively in parallel for providing tuning circuits of equal frequencies, and a separate capacitor arranged between both ends of the input side coil for providing an adjustability of the tuning frequency.

BRIEF DESCRIPTION OF THE DRAWINGS

FIGS. 3(a)-3(d) are exploded perspective views thereof; and

DETAILED DESCRIPTION OF THE INVENTION

Figure 1:
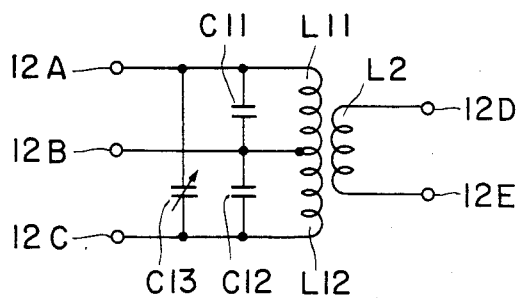
FIG. 1 is a wiring diagram of a preferred embodiment of a high frequency coil arrangement according to the present invention.
Figure 2:
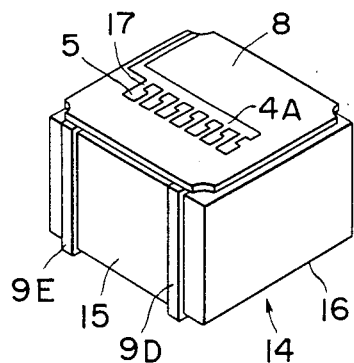
FIG. 2 is a perspective view thereof.

A preferred embodiment of the high frequency coil arrangement according to the present invention will now be described with reference to FIGS. 1, 2 and 3(a)-(d). FIG. 1 is a wiring schematic; FIG. 2 is a perspective view and FIG. 3 is an exploded perspective view.

Figure 4:
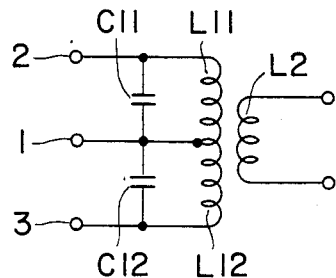
FIG. 4 is a wiring diagram of a conventional comparative high frequency coil arrangement.

In FIG. 1, those elements which have been illustrated hereinbefore with reference to FIG. 4, will be shown with similar reference symbols. In the high frequency coil arrangement according to the present invention, a capacitor C13, the capacitance of which can be varied and adjusted, is connected between terminals 12A and 12C, of the input coil. By provision of this capacitor C13, respective tuning circuits comprising a coil L11 and a fixed capacitor C11, and a coil L12 and a fixed capacitor C12, can have, the tuning frequencies thereof regulated while both circuits are kept in a balanced condition. The capacitance value of capacitor C13 is generally smaller than that of capacitors C11 and C12.

Necessary structure of the capacitor may be of smaller size so as to match with required overall dimensions of the high frequency coil arrangement, since it does not always require a movable member when comparing with the case of inductance variation. As for the capacitor C13, it is better to use a structure comprising opposite electrode formed on the opposite main surfaces of a substrate board relying upon the printing or the like technique, so as to provide the necessary capacitance therebetween and as capable of varying the capacitance value.

In FIGS. 2 and 3(a)-(d), a preferred specific structure of the high frequency coil arrangement according to the present invention is shown.

Substrate board 8 is made of a synthetic resin material or the like, such as ceramic, ferrite, or resin like epoxy with glass fiber. On the front side main surface of the board, one side electrode 4A of capacitor C13 is provided. This electrode 4A is formed with a number of finger-like branches 5, the most narrow portion 17 thereof being cut by application of laser beam, thereby the opposing electrode area against the opposite electrode 4B formed on the rear side main surface 6 of the board being modified for providing an optimum capacitance value. In addition to the electrode 4B, local metallic film layers 7A–7E are provided on the rear side main surface 6, the arrangement of which may be well seen in a see-through view shown as FIG. 3(b). Electrode 4a and metallic film layer 7A are connected by through conductor extending between the both surfaces of the board, while electrode 4B and metallic film layer 7C are connected on the rear surface 6. These electrodes and metallic film layers may be provided by a conventional printing technique.

Outer external terminals 9A–9E consisting of elongated metallic members are fixedly attached to metallic film layers on the rear surface 6, as an example, in such a way as: terminal 9A to film layer 7A; terminal 9B to film layer 7B and so on. Specific connection arrangements may be well understood by referring to suffix similarity.

A substantially square flange 10 and a circular one 11 are formed on a ferrite core 13, and input side coil elements L11 and L12 and output coil L2 are wound on the ferrite core 13 and connected with terminals 12A–12E mounted on the flange 10. Terminal 12A is connected to metallic film layer 7A; terminal 12B to film layer 7B, and so on. The connection arrangement may be well understood again with reference to suffix similarity. Between film layers 7A and 7B and between film layers 7B and 7C, chip-mode capacitors C11 and C12 are inserted respectively.

Although coils wound on the core 13 have been omitted from the drawing, input side coil elements L11 and L12 are connected with terminals 12A to 12C, while output side coil L2 is connected with terminals 12D and 12E, as is schematically shown in FIG. 1. The connection arrangements of these coils through terminals 12A–12E to the metallic film layers are also shown in the see-through view aforementioned of the rear surface 6.

With the core 13 introduced into a core 14 shaped into a top-opened box structure, the substrate board 8 closes the top end opening of the box core 14. The several terminals on the core 13 are electrically taken to the outside through external terminals.

Each of these outside terminals extends on and along the side surface 15 as well as the bottom surface 16 of core 14, so that such part thereof which extends on the latter surface 16 is kept in surface contract with conductors provided on another circuit board.

In the case of the high frequency coil arrangement according to the present invention, having the foregoing structural features, one side electrode 4A of capacitor C13 connecting the both ends of the input side coil assembly is exposed to the outside and by adjusting the capacity value of the capacitor, the tuning frequencies of the both component tuning circuits can be adjusted simultaneously.

Additionally, it should be noted that the high frequency coil arrangement according to the present invention can be utilized as a high frequency circuit used for improvement of spurious characteristics in other appliances than a DBM. Further, although the capacitors C11 and C12 as used in the foregoing embodiment are of a chip mode structure, they may be embodied in the similar manner as with capacitor C13, on the surfaces of a substrate board.

TECHNICAL ADVANTAGES

As has been clearly set forth in the foregoing, the high frequency coil arrangement according to the present invention by varying the capacitance value of a capacitor introduced between the both ends of the input side coil means, adjusted the tuning frequencies of two neighboring tuner circuits contained can be adjusted simultaneously and under well balanced conditions. On the contrary, if, as conventional, the inductance value is carried for a similar purpose, a movable part or parts must be manipulated with an inferior effect. Since there are no movable parts in the case of the present invention, the necessary adjusting means for modifying the tuning frequencies may be made smaller than is true of a variable inductance tuning arrangement, thus a high miniaturization is possible. Additionally, by employing the specific embodiment shown in FIGS. 2 and 3, an advantage is achieved in that a desired adjustment can be carried out in a similar way to that which is employed to modify and adjust resistors and the like circuit elements with use of laser beams.

What is claimed is:

1. A high frequency coil arrangement comprising input side- and output side-coils wound around a core having respective flanges at both ends thereof, one of said flanges carrying thereon a plurality of terminals electrically connected with said coil, a separate adjusting capacitor provided on and between both main surfaces of a substrate board, one side electrode of said capacitor being formed with a plurality of finger-like projections and mounted on the front main surface of said substrate board, and the opposite electrode of said capacitor being formed and mounted on the rear main surface of said substrate board, said rear main surface further mounting a plurality of metallic film layers for mounting coils, chip-mode fixed capacitors and external outside terminals, said substrate board covering an open-top end of an open-box shaped core, all the circuit elements fixed on the rear main surface of said substrate board being positioned within the interior hollow space of said open-box shaped core and a plurality of external outside terminals fixedly mounted on said substrate board extending partially to outside of said open box-shaped hollow core and respectively connected with said flange terminals.

2. The high frequency coil arrangement according to claim 1, wherein said external outside terminals extend on and along from a side wall surface to a bottom wall surface of said open box-shaped hollow core.

3. A high frequency coil arrangement, comprising an input side coil and an output side coil electromagnetically coupled with each other, said input side coil being divided into two coil elements having substantially equal inductances by provision of a tap, two parallel tuner capacitors respectively connected with said two coil elements for providing two tuner circuits of equal frequencies, and a further separate capacitor connected with both ends of said input side coil for adjustment of its tuning frequency, said separate capacitor being formed by electrodes arranged on opposing front and rear main surfaces of a substrate board, one of said electrodes having a plurality of finger-like projections, which can be cut off to provide a capacitance adjustment.

* * * * *